US012684695B2

(12) United States Patent
Wang

(10) Patent No.: US 12,684,695 B2
(45) Date of Patent: Jul. 14, 2026

(54) FLEXIBLE CIRCUIT BOARD AND METHOD OF FABRICATING THE SAME

(71) Applicants: HongQiSheng Precision Electronics (QinHuangdao) Co., Ltd., Hebei Province (CN); Avary Holding (Shenzhen) Co., Ltd., Shenzhen (CN); Garuda Technology Co., Ltd., New Taipei City (TW)

(72) Inventor: Chao Wang, Hebei Province (CN)

(73) Assignees: HONGQISHENG PRECISION ELECTRONICS (QINHUANGDAO) CO., LTD., Hebei Province (CN); AVARY HOLDING (SHENZHEN) CO., LTD., Shenzhen (CN); GARUDA TECHNOLOGY CO., LTD., New Taipei City (CN)

( * ) Notice: Subject to any disclaimer, the term of this patent is extended or adjusted under 35 U.S.C. 154(b) by 323 days.

(21) Appl. No.: 18/455,087

(22) Filed: Aug. 24, 2023

(65) Prior Publication Data

US 2025/0031313 A1     Jan. 23, 2025

(30) Foreign Application Priority Data

Jul. 20, 2023     (CN) .......................... 202310893760.9

(51) Int. Cl.
*H05K 1/18*          (2026.01)
*H05K 1/11*          (2006.01)
          (Continued)

(52) U.S. Cl.
CPC ............. *H05K 1/189* (2013.01); *H05K 1/118* (2013.01); *H05K 3/0061* (2013.01); *H05K 3/361* (2013.01)

(58) Field of Classification Search
CPC ........ H05K 1/189; H05K 1/118; H05K 1/028; H05K 1/0281; H05K 1/0296;
          (Continued)

(56) References Cited

U.S. PATENT DOCUMENTS

2006/0049130 A1*   3/2006   Watanabe ............ H05K 3/4611
                                                      174/250
2009/0013526 A1*   1/2009   Yang .................... H05K 3/0097
                                                      174/250
          (Continued)

FOREIGN PATENT DOCUMENTS

CN          1694600 A      11/2005
CN          201174842 Y    12/2008
          (Continued)

*Primary Examiner* — Roshn K Varghese
(74) *Attorney, Agent, or Firm* — MUNCY, GEISSLER, OLDS & LOWE, P.C.

(57)          ABSTRACT

A flexible circuit board and a method of fabricating the same are provided. The flexible circuit board includes a flexible substrate, in which the flexible substrate includes a first portion, two second portions, two third portions, two first bending portion and two second bending portions. The flexible circuit board includes first connecting circuit layers extending from an upper surface of the first portion through the first portions to upper surfaces of the second portions, second connecting circuit layers extending from lower surfaces of the second portions through the third portions to lower surfaces of the third portions, first circuit layers disposed on the upper surface of the first portion and second circuit layers disposed on the lower surfaces of the third portions. Therefore, the flexible circuit board can achieve no-via-hole and high density for circuit board.

13 Claims, 7 Drawing Sheets

100

(51) Int. Cl.
     *H05K 1/189*      (2026.01)
     *H05K 3/00*      (2006.01)
     *H05K 3/36*      (2006.01)

(58) Field of Classification Search
     CPC ... H05K 2201/055; H05K 2201/09063; H05K
                        2201/09736
     See application file for complete search history.

(56)             References Cited

U.S. PATENT DOCUMENTS

| | | | |
|---|---|---|---|
| 2015/0380371 A1* | 12/2015 | Chang | H01L 24/13 |
| | | | 438/614 |
| 2020/0296840 A1* | 9/2020 | Karavakis | H05K 1/115 |
| 2021/0282273 A1* | 9/2021 | Li | H05K 3/0029 |
| 2022/0230949 A1 | 7/2022 | Lu et al. | |
| 2023/0105026 A1 | 4/2023 | Park | |

FOREIGN PATENT DOCUMENTS

| | | | |
|---|---|---|---|
| CN | 104427761 A | 3/2015 | |
| CN | 107491221 A | 12/2017 | |
| CN | 110536542 A | 12/2019 | |
| CN | 210112381 U | 2/2020 | |
| CN | 112566390 B | 4/2022 | |
| CN | 115315071 A | 11/2022 | |
| CN | 116312226 A | 6/2023 | |
| JP | 2000236152 A | 8/2000 | |
| JP | 2011014809 A | 1/2011 | |
| TW | 202224507 A | 6/2022 | |

* cited by examiner

300

FLEXIBLE CIRCUIT BOARD AND METHOD OF FABRICATING THE SAME

RELATED APPLICATION

This application claims priority to China Application Serial Number 202310893760.9, filed Jul. 20, 2023, which is herein incorporated by reference.

BACKGROUND

Field of Invention

The disclosure relates to a flexible circuit board and a method of fabricating the same, and more particularly, to a bending flexible circuit board and a method of fabricating the same.

Description of Related Art

In recent years, with rapid growth of various electronic equipment, application of flexible circuit boards becomes wider, in which high density circuit board is main development trend nowadays. However, the high density circuit board has strict requirement for via size, circuit width, quantities of layers, and etc. Compared to typical circuit board, quantities of vias of the high density circuit board should be reduced to increase distribution area of circuit and quantities of electronic components.

SUMMARY

An aspect of the disclosure is to provide a flexible circuit board, which use connecting circuit layers to connect a bending flexible substrate, thereby achieving effect of no-via-hole and high density of the circuit board.

Another aspect of the disclosure is to provide a method of fabricating the flexible circuit board.

According to the aspect of the disclosure, the flexible circuit board is provided. The flexible circuit board includes a flexible substrate, in which the flexible substrate includes a first portion, two second portions, two third portions, two first bending portions and two second bending portions, the second portions are located above the third portions, and the first portion is located above the second portions. The two first bending portions are connected to the first portion and the two second portions, respectively, and the first portion and the second portions are located between the two first bending portions. The two second bending portions are connected to the two second portions and the two third portions, respectively, and the two second bending portions are located between the second portions. The flexible substrate includes plural first connecting circuit layers extending from an upper surface of the first portion of the flexible substrate through the first portion to upper surfaces of the second portions; plural second connecting circuit layers extending from lower surfaces of the second portions of the flexible substrate through the third portions to lower surfaces of the third portions; plural first circuit layers disposed over the upper surface of the first portion of the flexible substrate; and plural second circuit layers disposed over the lower surfaces of the third portions of the flexible substrate.

According to an embodiment of the present disclosure, the flexible circuit board further includes a third circuit layer disposed over a lower surface of the first portion of the flexible substrate and between the two second bending portions; and at least an embedded electronic component, disposed on the third circuit layer.

According to an embodiment of the present disclosure, the flexible circuit board further includes plural third circuit layers disposed over a lower surface of the first portion and the two second bending portions of the flexible substrate, respectively; and plural embedded electronic components disposed on the third circuit layers.

According to an embodiment of the present disclosure, the flexible circuit board further includes at least an electronic component disposed on the first circuit layers and/or the second circuit layers of the flexible substrate.

According to an embodiment of the present disclosure, the flexible circuit board further includes plural fixing pins disposed on ends of the second portions of the flexible substrate near the first bending portions and the second bending portions, respectively.

According to an embodiment of the present disclosure, the first connecting circuit layers and the second connecting circuit layers includes plural conductive pillars extending through the flexible substrate; and plural metal layers, disposed on the conductive pillars.

Another aspect of the disclosure provides a method of fabricating a flexible circuit board. The method includes providing a substrate, in which the substrate includes a flexible substrate, an upper metal layer, a lower metal layer, and the upper metal layer and the lower metal layer are located over an upper surface and a lower surface of the flexible substrate, respectively; depositing a first conductive layer and a second conductive layer on the upper metal layer and the lower metal layer, respectively; patterning the upper metal layer, the lower metal layer, the first conductive layer, and the second conductive layer to form a first connecting circuit layer and a second circuit layer on the lower surface of the flexible substrate and form a second connecting circuit layer and a first circuit layer on the upper surface of the flexible substrate; performing a laser drilling operation on the flexible substrate to form plural openings within the flexible substrate; performing a first bending operation on the flexible substrate to allow the first connecting circuit layer insert into a portion of the openings; and performing a second bending operation on the flexible substrate to allow the second connecting circuit layer insert into the remaining openings.

According to an embodiment of the present disclosure, after performing the laser drilling operation on the flexible substrate and before performing the first bending operation, the method further includes laminating the flexible substrate with plural cover films, a portion of the upper metal layer and a portion of the lower metal layer.

According to an embodiment of the present disclosure, the method further includes bonding at least an electronic component on the first circuit layer and/or the second circuit layer.

According to an embodiment of the present disclosure, patterning the upper metal layer, the lower metal layer, the first conductive layer, and the second conductive layer includes forming a third circuit layer over a lower surface of the flexible substrate.

According to an embodiment of the present disclosure, after performing the laser drilling operation on the flexible substrate and before performing the first bending operation, the method further includes bonding at least an embedded electronic component on the third circuit layer.

According to an embodiment of the present disclosure, when performing the first bending operation and the second bending portions, the method further includes filling plural adhesive layers between the flexible substrate and the first connecting circuit layer and the second connecting circuit layer.

According to the aspect of the disclosure, the flexible circuit board is provided. The flexible circuit board includes a flexible substrate including a first portion, two second portions, two third portions, two first bending portions and two second bending portions. The two first bending portions are connected to the first portion and the two second portions below the first portion, respectively, and the first portion and the second portions are located between the two first bending portions. The two second bending portions are connected to the two second portions and the two third portions below the second portions, respectively, and the two second bending portions are located between the second portions. The flexible circuit board includes plural first conductive pillars extending from an upper surface of the first portion of the flexible substrate through the first portion toward the second portions; plural first metal layers disposed on the upper surfaces of the second portions of the flexible substrate and connected to the first conductive pillars; plural second conductive pillars extending from lower surfaces of the second portions of the flexible substrate through the third portions toward the third portions; plural second metal layers disposed on the lower surfaces of the second portions of the flexible substrate and connected to the second conductive pillars; plural first circuit layers disposed over the upper surface of the first portion of the flexible substrate; and plural second circuit layers disposed over the lower surfaces of the third portions of the flexible substrate.

According to an embodiment of the present disclosure, the flexible circuit board further includes a third circuit layer disposed over a lower surface of the first portion of the flexible substrate and between the two second bending portions; and at least an embedded electronic component disposed on the third circuit layer.

According to an embodiment of the present disclosure, the flexible circuit board further includes plural third circuit layers disposed over a lower surface of the first portion and the two second bending portions of the flexible substrate; and plural embedded electronic components disposed on the third circuit layers.

According to an embodiment of the present disclosure, the flexible circuit board further includes a first electronic component disposed on the upper surface of the first portion and electrically connected to the first circuit layers.

According to an embodiment of the present disclosure, the flexible circuit board further includes at least a second electronic component disposed on the lower surfaces of the third portions and electrically connected to the second circuit layers.

According to an embodiment of the present disclosure, the flexible circuit board further includes plural fixing pins disposed on ends of the second portions of the flexible substrate near the first bending portions and the second bending portions, respectively.

According to an embodiment of the present disclosure, the flexible circuit board further includes plural cover films disposed on the first bending portions and the second bending portions.

According to an embodiment of the present disclosure, the flexible circuit board further includes plural adhesive layers disposed between the first portion and the second portions, between the second portions and the third portions, and between the two second bending portions of the flexible substrate.

Therefore, with the application of the flexible circuit board and the method of fabricating the same of the disclosure, the connecting circuit layers can make an electrical connection between layers by using the bending flexible substrate, thereby achieving effect of no-via-hole and high density of the circuit board, and increasing reliability and design variability of the circuit board.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
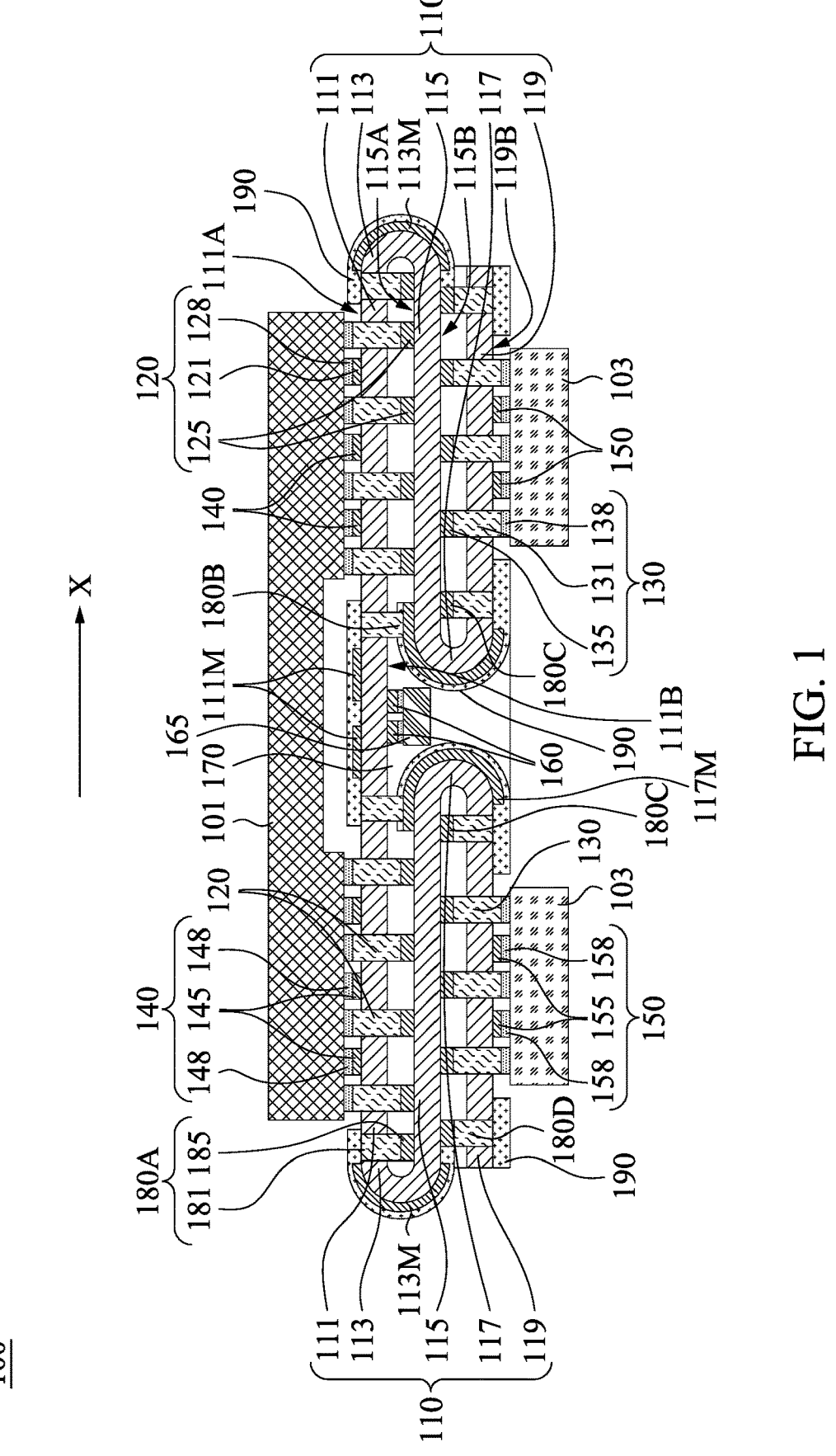
FIG. 1 illustrates a cross-section view of a flexible circuit board according to some embodiments of the disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Conventional multi-layer circuit boards use vias to electrically connect circuits between various layers. In other words, after forming blind holes or through holes, conductive holes can be formed by performing copper plating or copper paste filling. However, existence of the conductive holes occupies distribution space of the circuit board; thus, it is disadvantage to fabricate high density circuit boards and disadvantage to increase freedom of the circuit boards. Moreover, no matter the conductive holes are formed by using copper plating or copper paste filling, the flexible circuit boards cannot be bent, and connection of the conductive holes affect reliability of the circuit boards.

Therefore, as above, the flexible circuit board and the method of fabricating the same are provided. The connecting circuit layers can make electrical connection between multilayers by using the bending flexible substrate, thereby achieving effect of no-via-hole and high density of the circuit board, and increasing reliability and design variability of the circuit board.

Referring to FIG. 1, FIG. 1 illustrates a cross-section view of the flexible circuit board 100 according to some embodiments of the present disclosure. The flexible circuit board 100 includes a flexible substrate 110, in which the flexible substrate 110 includes a first portion 111, two second portions 115, two third portions 119, two first bending portions 113 and two second bending portions 117. The second portions 115 are located over the third portions 119, and the first portion 111 is located over the second portions 115.

The first bending portions 113 are connected to the first portion 111 and the two second portions 115, respectively, and along direction X, the first portion 111 and the second portions 115 are located between the two first bending portions 113. The second bending portions 117 are connected to the two second portions 115 and the two third portions 119, and along the direction X, the two second bending portions 117 are located between the two second portions 115 (and/or between the two third portions 119). In some embodiments, the two second bending portions 117 are both located between the two first bending portions 113.

The flexible circuit board 100 further includes first connecting circuit layers 120 and second connecting circuit layers 130. The first connecting circuit layers 120 are disposed to extend from an upper surface 111A of the first portion 111 of the flexible substrate 110 through the first portion 111 to upper surfaces 115A of the second portions 115. In some embodiments, the first connecting circuit layers 120 includes conductive pillars 121 extending through the first portion 111 and metal layers 125 over the upper surface 115A of the second portions 115. In some embodiments, the first connecting circuit layers 120 further includes ENIG (Electroless Nickel Immersion Gold) layers 128 disposed on the conductive pillars 121.

The second connecting circuit layers 130 are disposed to extend from lower surfaces 115B of the second portions 115 of the flexible substrate 110 through the third portion 119 to lower surfaces 119B of the third portions 119. In some embodiments, the second connecting circuit layers 130 includes conductive pillars 131 extending through the third portions 119 and metal layers 145 over the lower surfaces 115B of the second portions 115. In some embodiments, the second connecting circuit layers 130 further includes ENIG layers 138 disposed on the conductive pillars 131. As a result, the present disclosure doesn't need to use the conventional electrical connection such as through holes, conductive paste and/or tin, but use the first connecting circuit layers 120 and the second connecting circuit layers 130 to achieve interconnection between layers.

The flexible circuit board 100 further includes first circuit layers 140 and second circuit layers 150. The first circuit layers 140 are disposed over the upper surface 111A of the first portion 111 of the flexible substrate 110. In some embodiments, the first circuit layers 140 includes metal layers 145 disposed on the upper surface 111A of the first portion 111 and ENIG layers 148 over the metal layers 145.

The second circuit layers 150 are disposed over the lower surfaces 119B of the third portions 119. In some embodiments, the second circuit layers 150 include metal layers 155 disposed on the lower surfaces 119B of the third portions 119 and ENIG layers 158 over the metal layers 158.

In some embodiments, the flexible circuit board 100 further includes third circuit layers 160, in which the third circuit layers 160 are disposed over a lower surface 111B of the first portion 111 of the flexible substrate 110, and the third circuit layers 160 are located between the two second bending portion 117. Similarly, the third circuit layers 160 include metal layers and ENIG layers (not indicated). In some embodiments, the flexible circuit board 100 further includes an embedded electronic component 165 disposed on the third circuit layers 160. In other words, the third circuit layers 160 may be configured to electrically connect to the embedded electronic component 165. In some embodiments, the embedded electronic component 165 may be a capacitor, a resistor or a conductor, and etc. It is understood that although FIG. 1 only illustrates one embedded electronic component 165, quantities of the embedded electronic components is not limited in the present disclosure, and it can be adjusted according to application requirement.

In some embodiments, the flexible circuit board 100 includes adhesive layers 170. The adhesive layers 170 are filled between the first portion 111 and the second portions 115, between the second portions 115 and the third portions 119, and between the two second bending portions 117 of the flexible substrate 110. The adhesive layers 170 may be used to shape the flexible circuit board 100.

In some embodiments, the flexible circuit board 100 includes fixing pins 180A-180D, in which all the fixing pins 180A-180D include conductive pillars 181 extending through the flexible substrate 110 and metal layers 185 on the flexible substrate 110. The fixing pins 180A-180D are disposed to precisely locate bending positions of the flexible substrate 110.

In some embodiments, the fixing pins 180A are disposed to extend through the first portion 111 of the flexible substrate 110 to the upper surfaces 115A of the second portions 115, and located at ends of the second portions 115 near the first bending portions 113; the fixing pins 180B are disposed to extend through the first portion 111 of the flexible substrate 110 to the upper surfaces 115A of the second portions 115, and located at ends of the second portions 115 near the second bending portions 117; the fixing pins 180C are disposed to extend through the third portions 119 of the flexible substrate 110 to the lower surfaces 115B of the second portions 115, and located at ends of the second portions 115 near the second bending portions 117; the fixing pins 180D are disposed to extend through the third portions 119 of the flexible substrate 110 to the lower surfaces 115B of the second portions 115, and located at ends of the second portions 115 near the first bending portions 113 (or at ends of the third portions 119).

In some embodiments, the flexible circuit board 100 includes cover films 190 to achieve effect of protection and insulation. In some embodiments, the cover films 190 are disposed on the first bending portions 113 and the second bending portions 117 of the flexible substrate 110 to cover metal layers 113M and metal layers 117M, respectively, and cover the conductive pillars 181 of the fixing pins 180A-180D. In some embodiments, the cover films 190 are disposed on the upper surface 111A of the first portion 111 and the lower surfaces 119B of the third portions 119 to cover metal layers 111M on the first portion 111.

In some embodiments, the flexible circuit board 100 further includes an electronic component 101 and/or electronic components 103. The electronic component 101 is disposed on the upper surface 111A of the first portion 111 of the flexible substrate 110 and electrically connected to the first circuit layers 140 and/or the first connecting circuit layers 120. In some embodiments, the electronic component 101 is a module component, such as a screen module, a camera module or a speaker module, and etc. The electronic components 103 are disposed on the lower surfaces 119B of the third portions 119 and electrically connected to the second circuit layers 150 and/or the second connecting circuit layers 130. In some embodiments, the electronic components 103 may be connectors or system in package (SiP) components. It is understood that although FIG. 1 illustrates one electronic component 101 and two electronic components 103, quantities of the electronic components 101 and the electronic components 103 are not limited in the present disclosure, and it can be adjusted according to application requirement.

FIGS. 2A-2H illustrate cross-section views of intermediate stages in fabricating the flexible circuit board 100 according to some embodiments of the disclosure. The following discussion describes fabricating process of the flexible circuit board 100 by FIGS. 2A-2H. First, referring to FIG. 2A, a substrate 201 is provided. In some embodiments, the substrate 201 includes the flexible substrate 110, an upper metal layer 210A disposed on the upper surface 110A of the flexible substrate 110, and a lower metal layer 210B disposed on the lower surface 110B of the flexible substrate 110. In some embodiments, the substrate 201 may be a flexible copper clad laminate (FCCL).

Figures 2A, 2B:
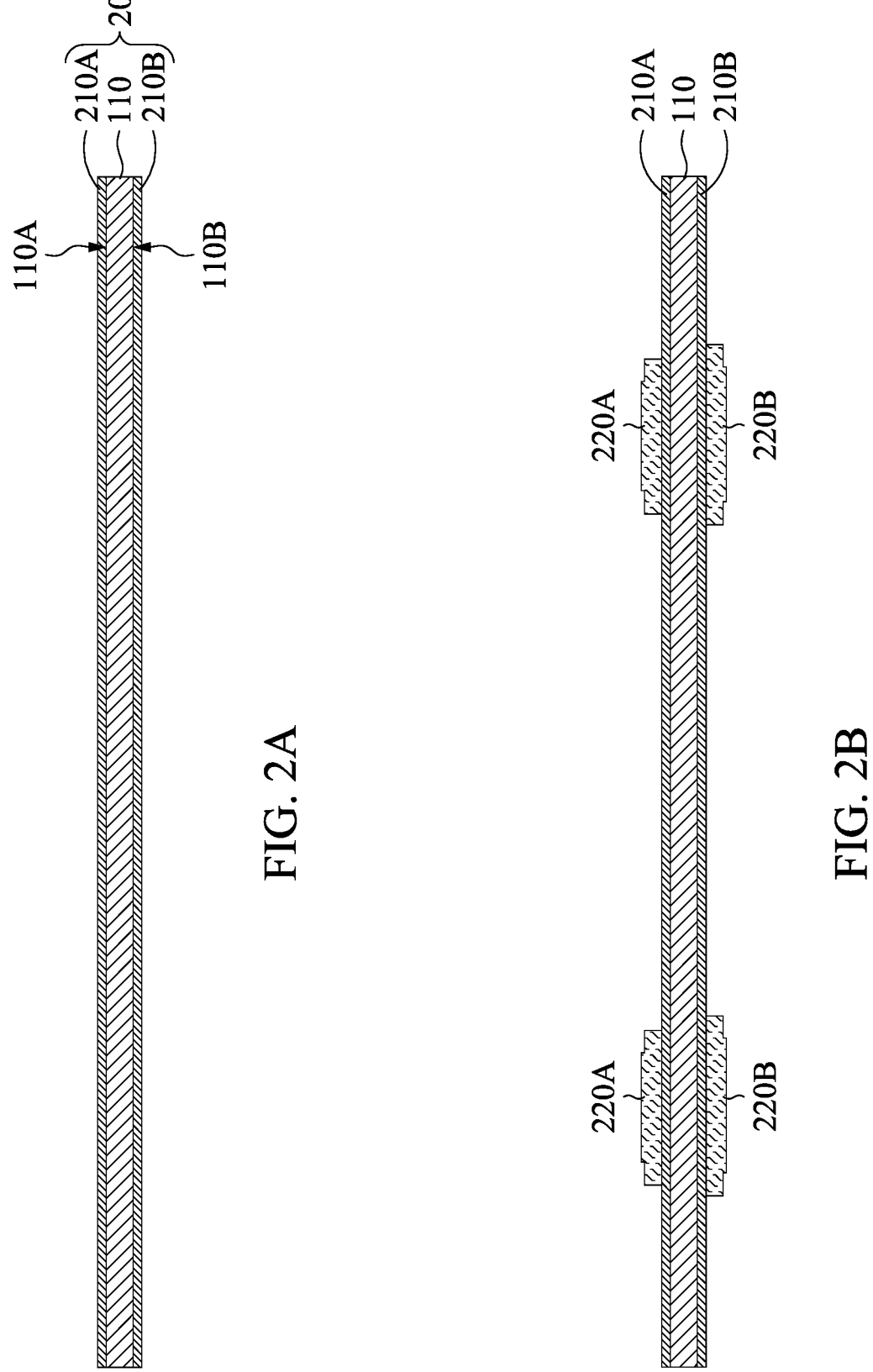
FIGS. 2A-2H illustrate cross-section views of intermediate stages in fabricating the flexible circuit board according to some embodiments of the disclosure.

Referring to FIG. 2B, a first conductive layer 220A and a second conductive layer 220B are deposited on specific regions of the upper metal layer 210A and the lower metal layer 210B, respectively. In some embodiments, structure of FIG. 2B is formed by performing two copper plating operations, thereby forming the first conductive layer 220A and the second conductive layer 220B with incompletely planar surfaces.

Figures 2C, 2D, 2E:
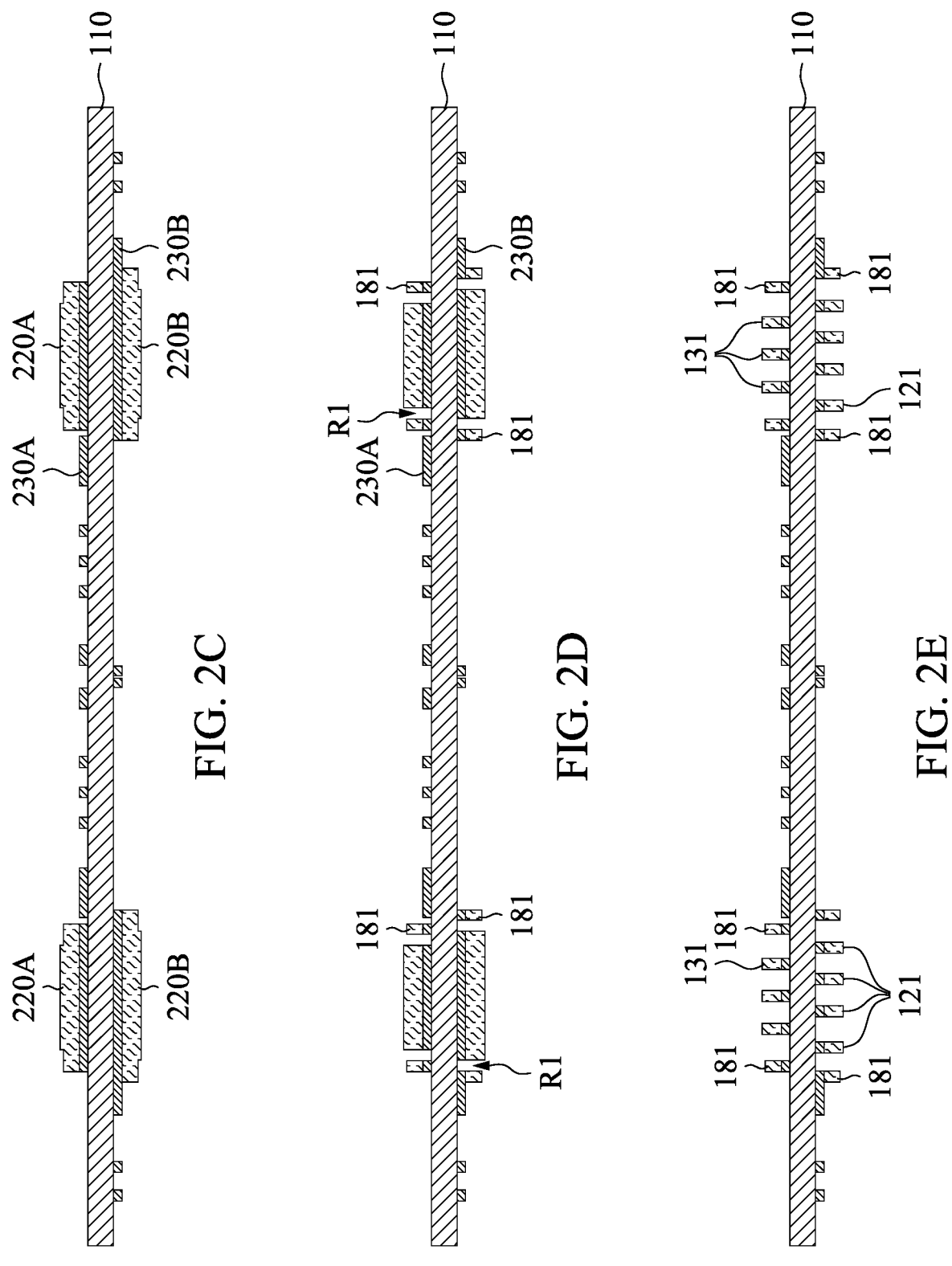

FIGS. 2C-2E are formed by performing patterning operations to the structure of FIG. 2B, thereby forming first connecting circuit layers 120, second connecting circuit layers 130, first circuit layers 140 and second circuit layers 150 (see FIG. 1). First, referring to FIG. 2C, the upper metal layer 210A and the lower metal layer 210B are patterned to form a first patterned metal layer 230A and a second patterned metal layer 230B, respectively. In some embodiments, the first patterned metal layer 230A and the second patterned metal layer 230B are approximately asymmetrical pattern, or they are misaligned with each other. In some embodiments, the first patterned metal layer 230A includes the first circuit layer 140, and the second patterned metal layer 230B includes the second circuit layer 150.

Subsequently, referring to FIG. 2D, the first conductive layer 220A and the second conductive layer 220B are patterned to form conductive pillars 181. In some embodiments, the remaining first conductive layer 220A or the remaining second conductive layer 220B and the conductive pillars 181 are separated by recesses R1, and the recesses R1 exposes the flexible substrate 110. In some embodiments, the conductive pillars 181 on the upper surface 110A of the flexible substrate 110 are substantially staggered with the conductive pillars 181 on the lower surface 110B of the flexible substrate 110.

Then, referring to FIG. 2E, the remaining first conductive layer 220A and the second conductive layer 220B are patterned to form the conductive pillars 131 of the second connecting circuit layer 130 on the upper surface 110A of the flexible substrate 110, and the conductive pillars 121 of the first connecting circuit layer 120 on the lower surface 110B of the flexible substrate 110, respectively. In some embodiments, the conductive pillars 131 and the conductive pillars 121 are disposed alternately, and each conductive pillar 131 is located between two adjacent conductively pillars 121.

Figure 2F:
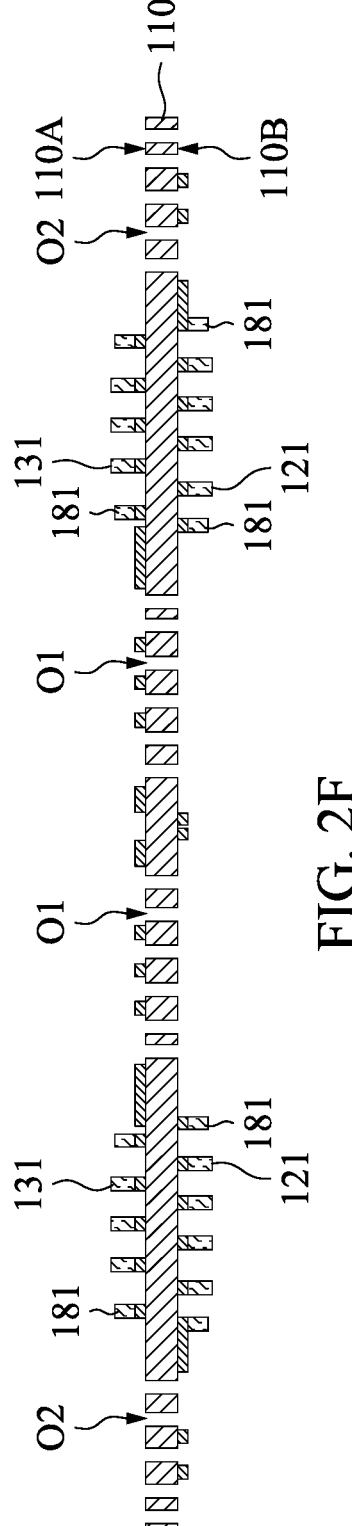

Referring to FIG. 2F, a laser drilling operation is performed on the flexible substrate 110 to form plural openings O1 and openings O2. The openings O1 are located between the conductive pillars 131 at two sides, and the openings O2 are located at opposite two ends of the flexible substrate 110. In some embodiments, quantities of the openings O1 are the same as total quantities of the conductive pillars 181 and the conductive pillars 121 on the lower surface 110B of the flexible substrate 110, while quantities of the openings O2 are the same as total quantities of the conductive pillars 181 and the conductive pillars 131 on the upper surface 110A of the flexible substrate 110.

Figure 2G:
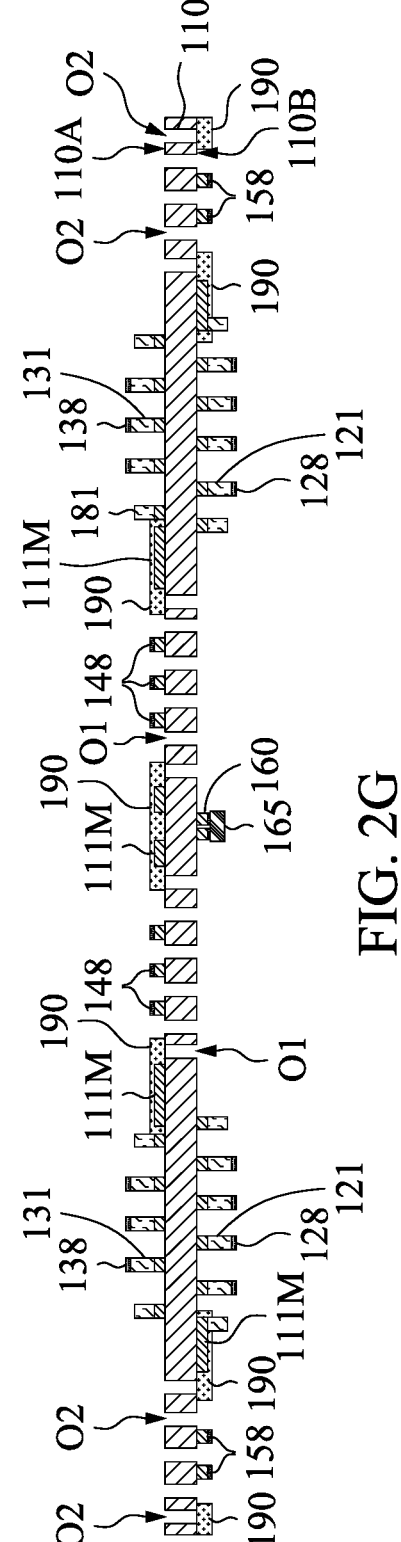

Referring to FIG. 2G at the same time, the first patterned metal layer 230A and the second patterned metal layer 230B (referring to FIG. 2D) further includes the metal layers 111M. In some embodiments, the second patterned metal layers 230 further include the third circuit layers 160. In FIG. 2G, the metal layer 111M is laminated with the cover film 190, one of the ends of the specific openings O1 of the flexible substrate 110 and one of the ends of the specific openings O2 of the flexible substrate 110. Subsequently, an ENIG process is performed to form ENIG layers 128 on the conductive pillars 121, form ENIG layers 138 on the conductive pillars 131, form ENIG layers 148 on the first patterned metal layers 230A uncovered by the cover films 190, and form ENIG layers 158 on the second patterned metal layers 230B. Then, the embedded electronic component 165 may be bonded to the third circuit layers 160.

Figure 2H:
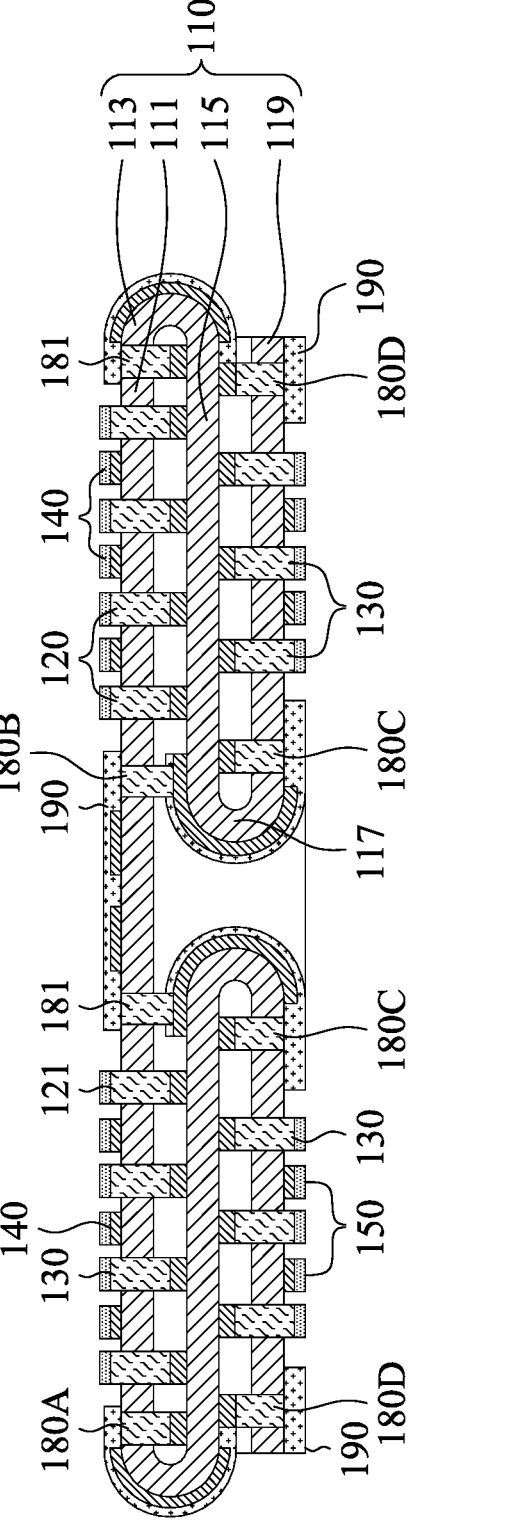

Referring to FIGS. 2G and 2H at the same time, two bending operations are performed on the structure of FIG. 2G to form the structure of FIG. 2H. First, a first bending operation is performed on the flexible substrate 110 to allow the conductive pillars 121 and the conductive pillars 181 on the upper surface 110A of the flexible substrate 110 insert into the openings O1, thereby forming the first connecting circuit layers 120 and the fixing pins 180A and 180B. Additionally, the first bending operation may allow the two first bending portions 113 of the flexible substrate to connect the first portion 111 and the remaining flexible substrate 110.

Then, a second bending operation is performed on the flexible substrate 110 to allow the conductive pillars 131 and the conductive pillars 181 on the lower surface 110B of the flexible substrate 110 insert into the openings O2, thereby forming the second connecting circuit layers 130 and the fixing pins 180C and 180D. The second bending operation may allow the two second bending portions 113 of the flexible substrate to connect the second portions 115 and the third portions 119. In some embodiments, the openings O1 and the openings O2 that the conductive pillars 181 inserted all have one end covered by the cover films 190. Thus far, the fabrication of the flexible circuit board 100 is almost completed. Subsequently, according to application requirement, the various electronic components (such as the electronic component 101 and/or the electronic components 103 illustrated in FIG. 1) may be disposed on the first circuit layer 140 or the second circuit layers 150, such that the flexible circuit board 100 as shown in FIG. 1 can be obtained.

Figure 3A:
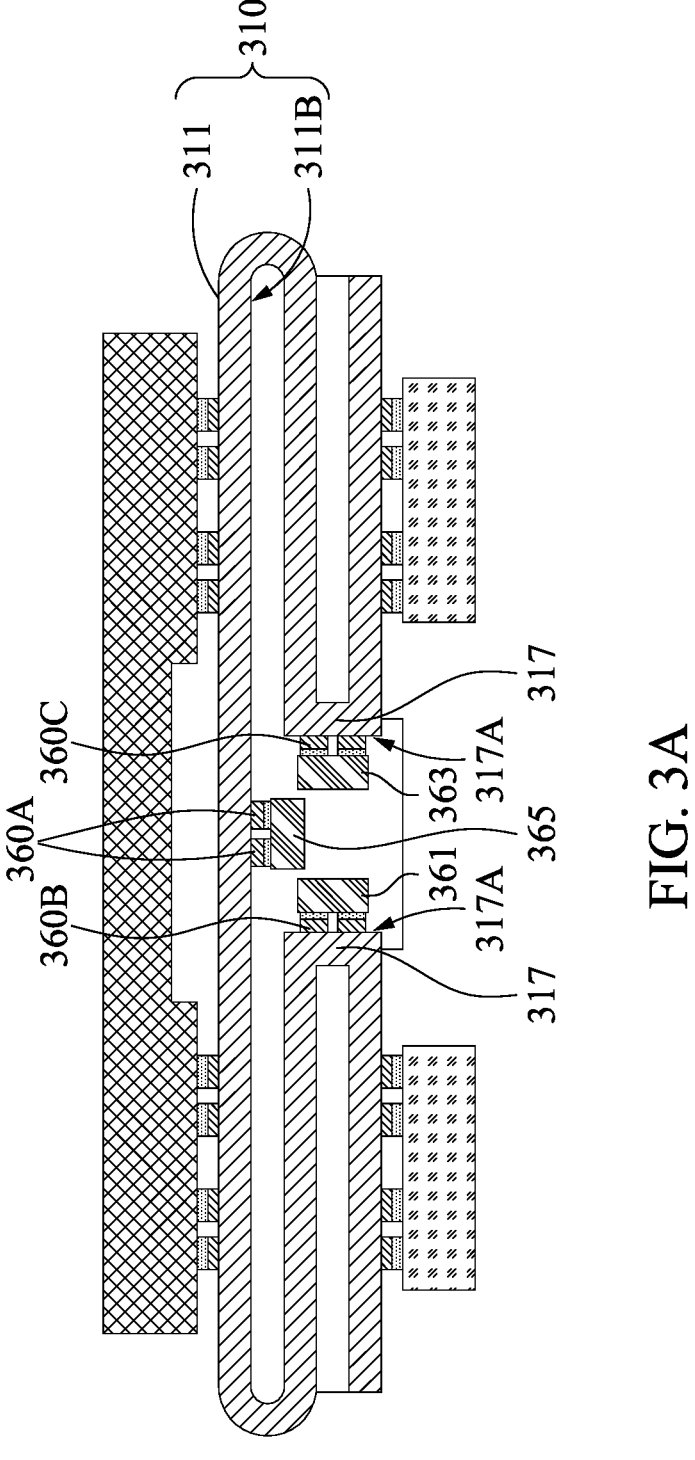
FIGS. 3A and 3B illustrate cross-section views of flexible circuit boards according to some embodiments of the disclosure.
Figure 3B:
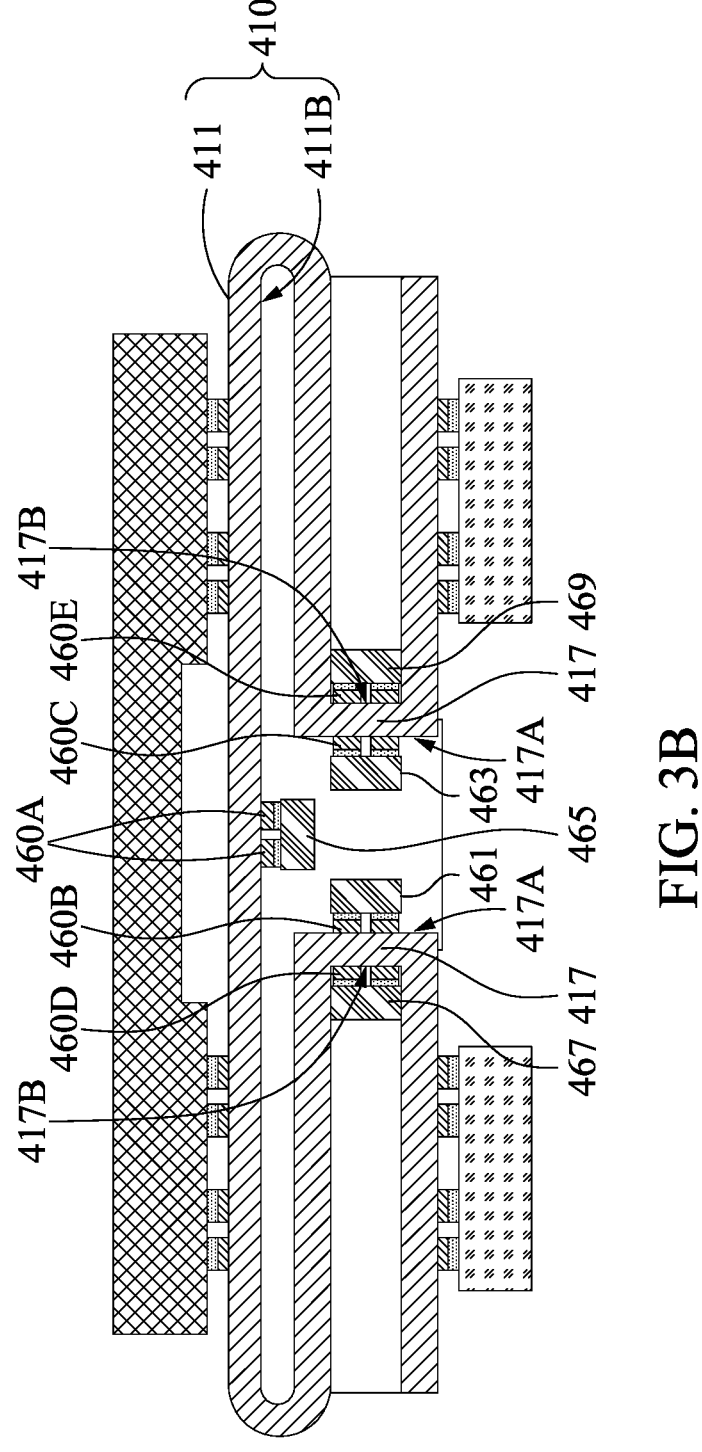

In addition, as shown in FIGS. 3A and 3B, more embedded electronic components can be disposed in the flexible circuit board. FIGS. 3A and 3B illustrate cross-section views of a flexible circuit board 300 and a flexible circuit board 400 according to some embodiments of the present disclosure. For clarity and simplification, several components, such as the first connecting circuit layers and the second connecting circuit layers, are omitted in FIGS. 3A and 3B.

In some embodiments, referring to FIG. 3A, the flexible circuit board 300 includes the third circuit layers 360A, the third circuit layers 360B, and the third circuit layers 360C, in which the third circuit layers 360A are disposed on the lower surface 311B of the first portion 311, and the third circuit layers 360B and the third circuit layers 360C are disposed on outer surfaces 317A of the second bending portions 317 of a flexible substrate 310, respectively. Therefore, the flexible circuit board 300 may arrange three embedded electronic components, for example, the embedded electronic components 365 is electrically connected on the third circuit layers 360A, the embedded electronic components 361 is electrically connected on the third circuit layers 360B, and the embedded electronic components 363 is electrically connected on the third circuit layers 360C.

In some embodiments, referring to FIG. 3B, the flexible circuit board 400 includes the third circuit layers 460A, the third circuit layers 460B, the third circuit layers 460C, the third circuit layers 460D, and the third circuit layers 460E, in which the third circuit layers 460A are disposed on the lower surface 411B of the first portion 411, the third circuit layers 460B and the third circuit layers 460C are disposed on the outer surfaces 417A of the second bending portions 417 of a flexible substrate 410, respectively, and the third circuit layers 460D and the third circuit layers 460E are disposed on inner surfaces 417B of the second bending portions 417 of a flexible substrate 410, respectively. Therefore, the flexible circuit board 400 may arrange five embedded electronic components, for example, the embedded electronic components 465 is electrically connected on the third circuit layers 460A, the embedded electronic components 461 is electrically connected on the third circuit layers 460B, the embedded electronic components 463 is electrically connected on the third circuit layers 460C, the embedded electronic components 467 is electrically connected on the third circuit layers 460D, and the embedded electronic components 469 is electrically connected on the third circuit layers 460E.

As described above, the present disclosure provides the flexible circuit board and the method of fabricating the same. The connecting circuit layers can make electrical connection between multi-layers by using the bending flexible substrate, and the fixing pins are used for precise location, thereby achieving effect of no-via-hole and high density of the circuit board, and increasing reliability of the circuit board. Moreover, the flexible circuit board of the present disclosure can allow numbers of electronic components to be packaged; and thus it is beneficial to increase design variability.

It is understood that the aforementioned steps described in the embodiments of the disclosure can be combined or skipped, and the order thereof can be adjusted according actual requirements.

Although the disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the disclosure without departing from the scope or spirit of the invention. In view of the foregoing, it is intended that the disclosure cover modifications and variations of this invention provided they fall within the scope of the following claims.

What is claimed is:

1. A flexible circuit board, comprising:
a flexible substrate, comprising a first portion, two second portions, two third portions, two first bending portions and two second bending portions, wherein the second portions are located above the third portions, and the first portion is located above the second portions,
   wherein the two first bending portions are connected to the first portion and the two second portions, respectively, and the first portion and the second portions are located between the two first bending portions,
   wherein the two second bending portions are connected to the two second portions and the two third portions, respectively, and the two second bending portions are located between the second portions,
a plurality of first connecting circuit layers, extending from an upper surface of the first portion of the flexible substrate through the first portion to upper surfaces of the second portions;
a plurality of second connecting circuit layers, extending from lower surfaces of the second portions of the flexible substrate through the third portion to lower surfaces of the third portions;
a plurality of first circuit layers, disposed over the upper surface of the first portion of the flexible substrate;
a plurality of second circuit layers, disposed over the lower surfaces of the third portions of the flexible substrate;
a third circuit layer, disposed over a lower surface of the first portion of the flexible substrate and between the two second bending portions; and
at least an embedded electronic component, disposed on the third circuit layer, and one of the at least an embedded electronic component is closer to the two second bending portions than to the two second portions.

2. The flexible circuit board of claim 1, further comprising:
a plurality of third circuit layers, disposed over a lower surface of the first portion and the two second bending portions of the flexible substrate, respectively; and
a plurality of embedded electronic components, disposed on the third circuit layers.

3. The flexible circuit board of claim 1, further comprising:
at least an electronic component, disposed on the first circuit layers and/or the second circuit layers of the flexible substrate.

4. The flexible circuit board of claim 1, further comprising:
a plurality of fixing pins, disposed on ends of the second portions of the flexible substrate near the first bending portions and the second bending portions, respectively.

5. The flexible circuit board of claim 1, wherein the first connecting circuit layers and the second connecting circuit layers comprises:
a plurality of conductive pillars, extending through the flexible substrate; and
a plurality of metal layers, disposed on the conductive pillars.

6. A flexible circuit board, comprising:

a flexible substrate, comprising a first portion, two second portions, two third portions, two first bending portions and two second bending portions, wherein the two first bending portions are connected to the first portion and the two second portions below the first portion, respectively, and the first portion and the second portions are located between the two first bending portions, wherein the two second bending portions are connected to the two second portions and the two third portions below the second portions, respectively, and the two second bending portions are located between the second portions, a plurality of first conductive pillars, extending from an upper surface of the first portion of the flexible substrate through the first portion toward the second portions, wherein the first conductive pillars are formed by inserting into first openings on the first portion of the flexible substrate;

a plurality of first metal layers, disposed on upper surfaces of the second portions of the flexible substrate and connected to the first conductive pillars;

a plurality of second conductive pillars, extending from lower surfaces of the second portions of the flexible substrate through the third portions toward the third portions, wherein the second conductive pillars are formed by inserting into second openings on the third portion of the flexible substrate;

a plurality of second metal layers, disposed on the lower surfaces of the second portions of the flexible substrate and connected to the second conductive pillars;

a plurality of first circuit layers, disposed over the upper surface of the first portion of the flexible substrate; and a plurality of second circuit layers, disposed over the lower surfaces of the third portions of the flexible substrate.

7. The flexible circuit board of claim 6, further comprising:

a third circuit layer, disposed over a lower surface of the first portion of the flexible substrate and between the two second bending portions; and at least an embedded electronic component, disposed on the third circuit layer.

8. The flexible circuit board of claim 6, further comprising:

a plurality of third circuit layers, disposed over lower surfaces of the first portion and the two second bending portions of the flexible substrate; and a plurality of embedded electronic components, disposed on the third circuit layers.

9. The flexible circuit board of claim 6, further comprising:

a first electronic component, disposed on the upper surface of the first portion and electrically connected to the first circuit layers.

10. The flexible circuit board of claim 6, further comprising:

at least a second electronic component, disposed on the lower surfaces of the third portions and electrically connected to the second circuit layers.

11. The flexible circuit board of claim 6, further comprising:

a plurality of fixing pins, disposed on ends of the second portions of the flexible substrate near the first bending portions and the second bending portions, respectively.

12. The flexible circuit board of claim 6, further comprising:

a plurality of cover films, disposed on the first bending portions and the second bending portions.

13. The flexible circuit board of claim 12, further comprising:

a plurality of adhesive layers, disposed between the first portion and the second portions, between the second portions and the third portions, and between the two second bending portions of the flexible substrate.

* * * * *